(12) United States Patent
Noguchi

(10) Patent No.: US 6,550,039 B2
(45) Date of Patent: *Apr. 15, 2003

(54) CIRCUIT DESIGN METHOD FOR DESIGNING CONDUCTIVE MEMBERS WITH A MULTILAYERED STRUCTURE TO HAVE ANTENNA SIZED OF PROPER VALUES

(75) Inventor: Ko Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 44 days.

This patent is subject to a terminal disclaimer.

(21) Appl. No.: 09/825,331

(22) Filed: Apr. 4, 2001

(65) Prior Publication Data

US 2001/0044925 A1 Nov. 22, 2001

(30) Foreign Application Priority Data

Apr. 5, 2000 (JP) ........................................ 2000-103623

(51) Int. Cl.[7] ............................................... G06F 17/50
(52) U.S. Cl. ............................ 716/4; 716/10; 257/359; 257/360
(58) Field of Search ........................ 716/1–21; 257/359, 257/360, 364

(56) References Cited

U.S. PATENT DOCUMENTS 6,393,603 B1 * 5/2002 Noguchi ........................ 716/10

FOREIGN PATENT DOCUMENTS

JP 11-186394 7/1999

* cited by examiner

Primary Examiner—Timothy P. Callahan
Assistant Examiner—An T. Luu
(74) Attorney, Agent, or Firm—Young & Thompson

(57) ABSTRACT

A circuit design method for designing conductive members with a multilayered structure to have antenna sizes of proper values is disclosed. Individual damage is calculated for each of a plurality of antenna units of the conductive members with a multilayered structure, and an integrated circuit device is designed such that a total amount of the separately calculated individual damage is less than a predetermined permissible amount. It is possible to accurately calculate a total amount of damage to a gate insulating film even when the plurality of antenna units of the conductive members with a multilayered structure have different degrees of damage and antenna ratios from one another, and an integrated circuit device of optimal structure can be designed with high efficiency.

13 Claims, 5 Drawing Sheets

CIRCUIT DESIGN METHOD FOR DESIGNING CONDUCTIVE MEMBERS WITH A MULTILAYERED STRUCTURE TO HAVE ANTENNA SIZED OF PROPER VALUES

BACKGROUND OF THE INVENTION

1. Field of the Invention

The present invention relates to a method and an apparatus of circuit design for designing integrated circuit devices, and more particularly to a method and an apparatus of circuit design for designing conductive members connected to a gate insulating film of a transistor element to have antenna sizes of proper values in design of an integrated circuit device including the conductive members.

2. Description of the Related Art

Integrated circuit devices are currently used in various types of electronic equipment. Such an integrated circuit device has various circuit elements such as transistors formed therein with a thin-film technology. A transistor element formed in an integrated circuit device with the thin-film technology has a gate insulating film connected to conductive members such as a gate electrode, metal wiring and the like.

For example, in integrated circuit device 1 in the process of manufacture illustrated in FIG. 1, gate electrode 4 and metal wiring 5 are connected as conductive members to gate insulating film 3 of transistor element 2, and metal wiring 5 is located on the upper surface of insulating layer 6 which is an insulating member. Photoresist 7 which is an insulating member is temporarily deposited as a mask on the upper surface of metal wiring 5. Metal wiring 5 is processed through plasma anisotropic etching which uses photoresist 7 as a mask.

In integrated circuit device 1 as mentioned above, when metal wiring 5 is subjected to the anisotropic etching, the exposed side surface of metal wiring 5 is exposed to plasma and may receive electric charges in the plasma. Since the electric charge received by metal wiring 5 flows from gate electrode 4 to semiconductor substrate 8 through gate insulating film 3, gate insulating film 3 may be damaged.

The presence or absence of the damage depends on the density of the electric charges flowing through gate insulating film 3, and the density of the electric charge depends on the intensity of the plasma, the area of gate insulating film 3, and the antenna size of metal wiring 5. In other words, if the intensity of the plasma used in the manufacturing process is known, only the area of gate insulating film 3 and the antenna size of metal wiring 5 may be taken into consideration in design.

Conventionally, maximum antenna size $M0$ of a conductive member permissible with respect to reference area $S0$ of a gate insulating film is defined, and the ratio of them is represented as maximum permissible antenna ratio $R0$ by:

$$R0 = M0/S0$$

When a new gate insulating film with area $Sj$ is actually formed, damage to the gate insulating film can be prevented by setting antenna size $Mi$ of an actual conductive member connected to the gate insulating film in accordance with:

$$Mi \leq R0 \times Sj$$

The antenna size of a conductive member refers to the size of the portion of the conductive member serving as an antenna, for example the area of the exposed portion of the metal wiring as mentioned above. When reference metal wiring has the same film thickness as that of new metal wiring, the antenna size thereof can be approximately represented by the area of the upper surface of the metal wiring if only the upper surface of the metal wiring is exposed, or if only the side surface of the metal wiring is exposed, the antenna size can be approximately represented by the overall length of the perimeter of the metal wiring.

In an actual integrated circuit device, as shown in FIG. 2, a multilayered structure including a plurality of conductive members may be connected to a single gate insulating film such that each of the conductive members serves as an antenna. In such a case, each of the plurality of conductive members is designed to have an antenna size as described above. However, no consideration is given to cumulative damage caused by the plurality of antennas to the gate insulating film, and excessive damage to the gate insulating film occurs.

For example, Japanese Patent Laid-open Publication No. 11-186394 discloses a method in which the lengths of wiring connected to a gate electrode are summed, and if the result exceeds a permissible value, certain measures are taken. When the method is applied to conductive members with a multilayered structure, it is contemplated that an antenna size is detected in each of the layers of the conductive members with a multilayered structure and the derived antenna sizes are summed.

In the case of the conductive members with a multilayered structure, however, since the respective layers are not subjected to the same processing, the degrees of damage to a gate electrode may vary even with the same antenna sizes. In addition, the conductive members with a multilayered structure are configured, for example, to connect wiring patterns formed on the surfaces of the respective layers through contact vias, in which the permissible antenna ratios of the wiring patterns are different from those of the contact vias.

Thus, it is actually difficult to form actual conductive members with a multilayered structure with optimal antenna sizes when cumulative antenna size $\Sigma Mi$ of the conductive members is set as described above to satisfy the following relationship with respect to area $Sj$ of the gate insulating film and maximum permissible antenna ratio $R0$:

$$Mi \leq R0 \times Sj$$

SUMMARY OF THE INVENTION

It is an object of the present invention to provide a method and an apparatus of circuit design capable of designing conductive members with a multilayered structure connected to a gate insulating film of a transistor element to have antenna sizes of proper values in design of an integrated circuit device including the conductive members.

In a circuit design method of the present invention, for designing an integrated circuit device including conductive members with a multilayered structure connected to a gate insulating film of a transistor element, individual damage is calculated first for each of a plurality of antenna units of the conductive members with a multilayered structure. The integrated circuit device is designed such that a total amount of the separately calculated individual damage is less than a predetermined permissible amount. Therefore, even when the plurality of antenna units of the conductive members with a multilayered structure have different degrees of damage or antenna ratios from one another, the total amount of damage to the gate insulating film can be accurately calculated.

In another circuit design method of the present invention, from antenna size Mi of each of n antenna units of the conductive members and actual area Sj of the gate insulating film, antenna ratio Ri is calculated for each of the n antenna units of the conductive members as Ri=Mi/Sj. In addition, from maximum permissible antenna ratio Rmi of each of the n antenna units of the conductive members with respect to actual area Sj of the gate insulating film, individual damage Di is calculated as Di=f(Ri/Rmi) for each of the n antenna units of the conductive members with respect to actual area Sj of the gate insulating film. From the calculation results, damage total amount $\Sigma D$ acting on the gate insulating film is calculated as $\Sigma D$=D1+D2+ ... +Dn. The integrated circuit device is designed such that damage total amount $\Sigma D$ is less than 1.

Therefore, an integrated circuit device designed with the circuit design method of the present invention is designed to achieve proper antenna sizes in a plurality of antenna units of conductive members with a multilayered structure connected to a gate insulating film of a transistor element. Thus, even when plasma processing in the manufacturing process results in electrical charges flowing into the plurality of antenna units of the conductive members with a multilayered structure, damage accumulated on the gate insulating film does not become critical.

In an embodiment of the present invention, individual damage Di of each of n antenna units of conductive members is calculated as $Di=(Ri/Rmi)^a$.

In the embodiment of the present invention, since a constant a satisfies $0.5 \leq a \leq 1.8$, individual damage Di is accurately calculated with simple operation processing.

In another embodiment of the present invention, when maximum permissible antenna size M0 is defined for each of n antenna units of conductive members with respect to reference area S0 of a gate insulating film, maximum permissible antenna ratio Rmi of each of n antenna units of conductive members with respect to actual area Sj of a gate insulating film is calculated as $Rmi=(M0i/S0) \times (S0/Sj)^b$.

In another embodiment of the present invention, Rmi is calculated as $Rmi=(M0i/S0) \times [\alpha/(\beta+Sj/S0)]$.

In the aforementioned embodiment of the present invention, a constant b satisfies $-2.0 \leq b \leq 0.8$, and constants $\alpha$, $\beta$ satisfy $\beta < \alpha$, $0.9 \leq \alpha \leq 2.2$, $0.1 \leq \beta \leq 1.3$.

According to the present invention, even when actual area Sj of a gate insulating film is not proportional to actual maximum permissible antenna sizes M0i of conductive members, it is possible to accurately and readily represent maximum antenna ratio Rmi approximately for each of n antenna units of the conductive members with respect to actual area Sj of the gate insulating film.

The above and other objects, features and advantages of the present invention will become apparent from the following description with reference to the accompanying drawings which illustrate examples of the present invention.

DETAILED DESCRIPTION OF THE PREFERRED EMBODIMENTS

First Embodiment

A circuit design apparatus according to an embodiment of the present invention is used for design of an integrated circuit device including conductive members with a multilayered structure connected to a gate insulating film of a transistor element, and determines whether the area of the gate insulating film of the transistor element in the designed integrated circuit device is in a proper relationship with the antenna sizes of the conductive members with a multilayered structure.

The antenna size of a conductive member refers to the size of the portion of the conductive member serving as an antenna, for example the area of an exposed portion of metal wiring. When reference metal wiring has the same film thickness as that of new metal wiring, the antenna size can be approximately represented by the area of the upper surface of the metal wiring if only the upper surface of the metal wiring is exposed as in a contact via. Alternatively, if only the side surface of the metal wiring is exposed as in a wiring pattern, the antenna size can be approximately represented by the overall length of the perimeter of the metal wiring.

Conductive members with a multilayered structure connected to a single gate insulating film of a transistor element as mentioned above are configured, for example, to have a plurality of wiring patterns connected through a plurality of contact vias. The plurality of wiring patterns and the plurality of contact vias individually serve as antenna units.

Since the wiring patterns are greatly different in shape from the contact vias, they are also different from one another in maximum permissible antenna ratios Rmi. In addition, n antenna units of the conductive members with a multilayered structure are subjected to processing of different contents from one another, which also causes them to have different maximum permissible antenna ratios Rmi.

A circuit design method with the circuit design apparatus of the embodiment is based on the premises that conductive members with a multilayered structure are divided into n antenna units, and maximum permissible antenna ratios Rmi depending on their shapes and performed processing have been calculated for the respective antenna units.

Figure 1:
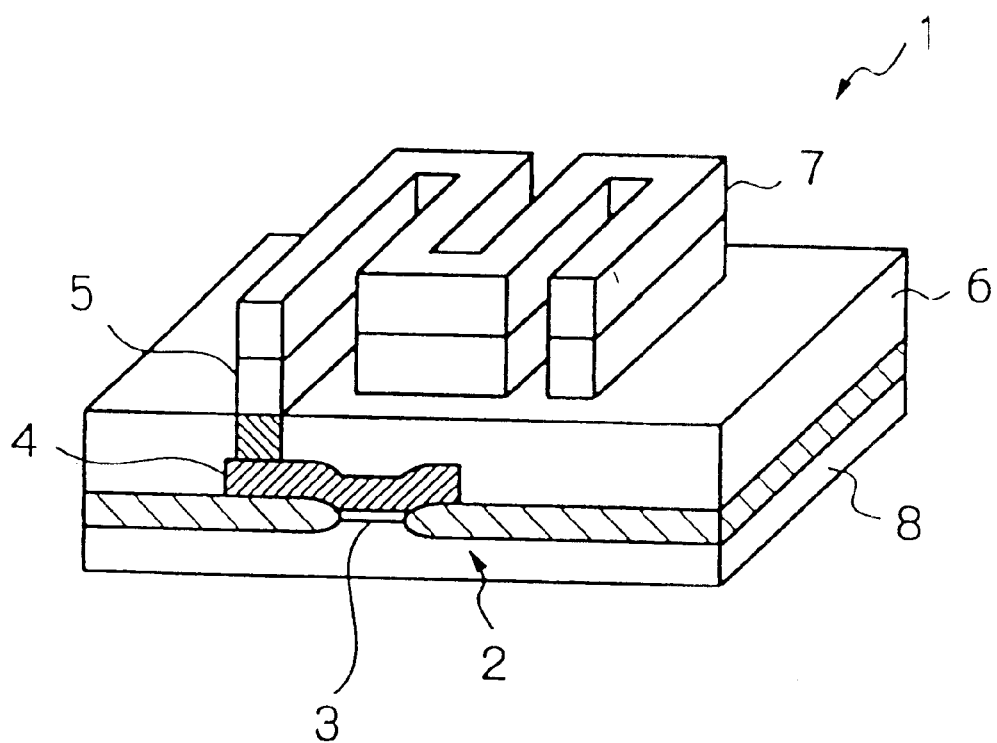
FIG. 1 is a perspective view showing essentials of an integrated circuit device in the process of manufacture.
Figure 2:
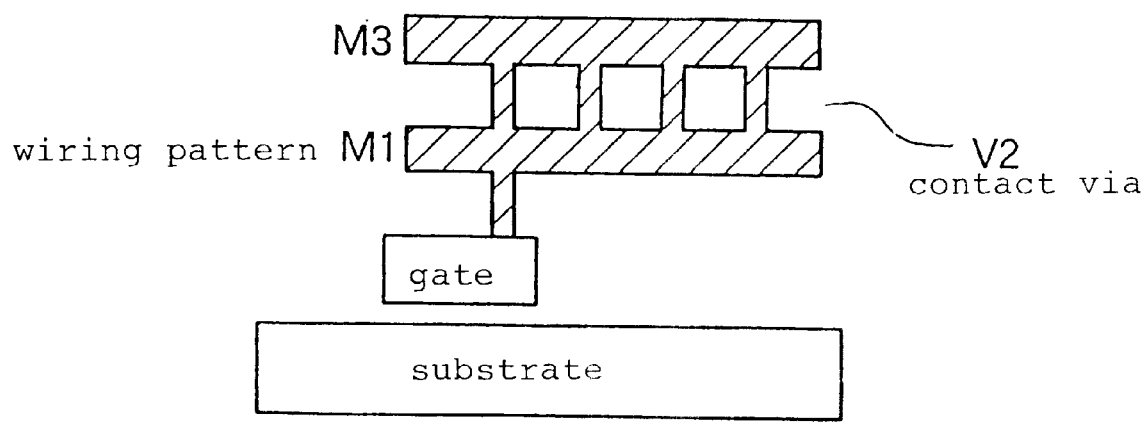
FIG. 2 is a side sectional view showing essentials of an integrated circuit device in the process of manufacture.
Figure 3:
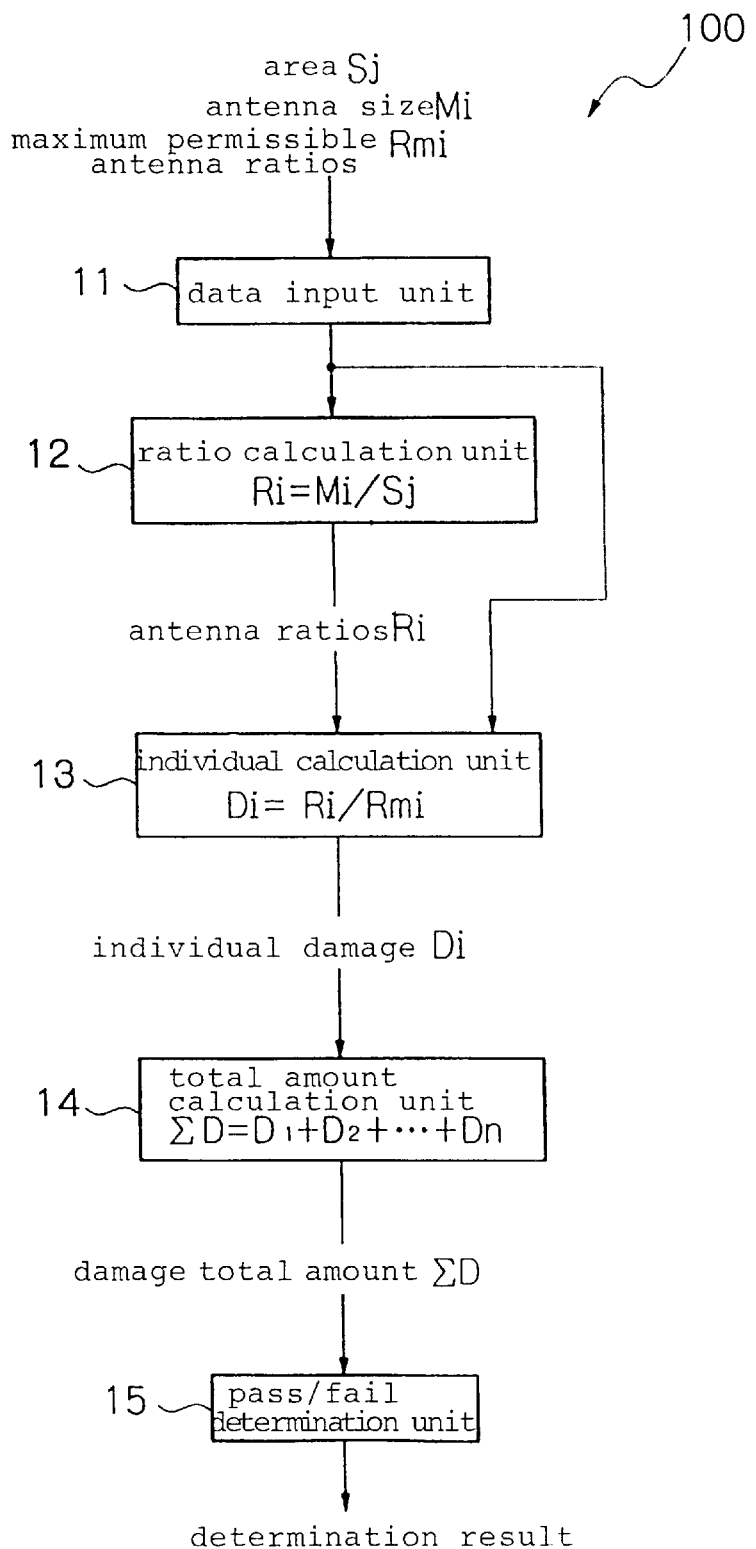
FIG. 3 is a block diagram showing a configuration of a circuit design apparatus according to an embodiment of a circuit design apparatus of the present invention.

As shown in FIG. 3, circuit design apparatus 100 of the embodiment comprises data input unit 11, ratio calculation unit 12, individual calculation unit 13, total amount calculation unit 14, and pass/fail determination unit 15.

Data input unit 11 receives actual area Sj of a gate insulating film, maximum permissible antenna ratios Rmi of respective n antenna units of conductive members with respect to actual area Sj, and actual antenna sizes Mi of the respective n antenna units of the conductive members.

The aforementioned i is one of serial numbers indicating an arbitrary one of the n antenna units of the conductive members with a multilayered structure. Data input of maximum permissible antenna ratios Rmi, for $1 \leq i \leq n$, of the respective n antenna units means that all of Rm1, Rm2, ..., Rmi, ..., Rmn are individually input as data.

When maximum permissible antenna size M0i for each of the n antenna units of the conductive members is defined with respect to reference area S0 of the gate insulating film, maximum permissible antenna ratio Rmi for each of the antenna units is derived by Rmi=M0i/S0.

Ratio calculation unit 12 calculates antenna ratio Ri of each of the n antenna units of the conductive members with respect to actual area Sj of the gate insulating film in response to the data input to data input unit 11 with the following equation:

$$Ri=Mi/Sj$$

Individual calculation unit 13 calculates individual damage Di of each of the n antenna units of the conductive members with respect to actual area Sj of the gate insulating film with the following equation:

$$Di=Ri/Rmi$$

Total amount calculation unit 14 calculates damage total amount $\Sigma D$ acting on the gate insulating film from the calculation results in individual calculation unit 13 with the following equation:

$$\Sigma D=D1+D2+\ldots+Dn$$

Pass/fail determining unit 15 indicates that design is faulty when damage total amount $\Sigma D$ calculated by total amount calculation unit 14 is equal to or higher than 1, or indicates that the design is favorable when damage total amount $\Sigma D$ is lower than 1.

Figure 4:
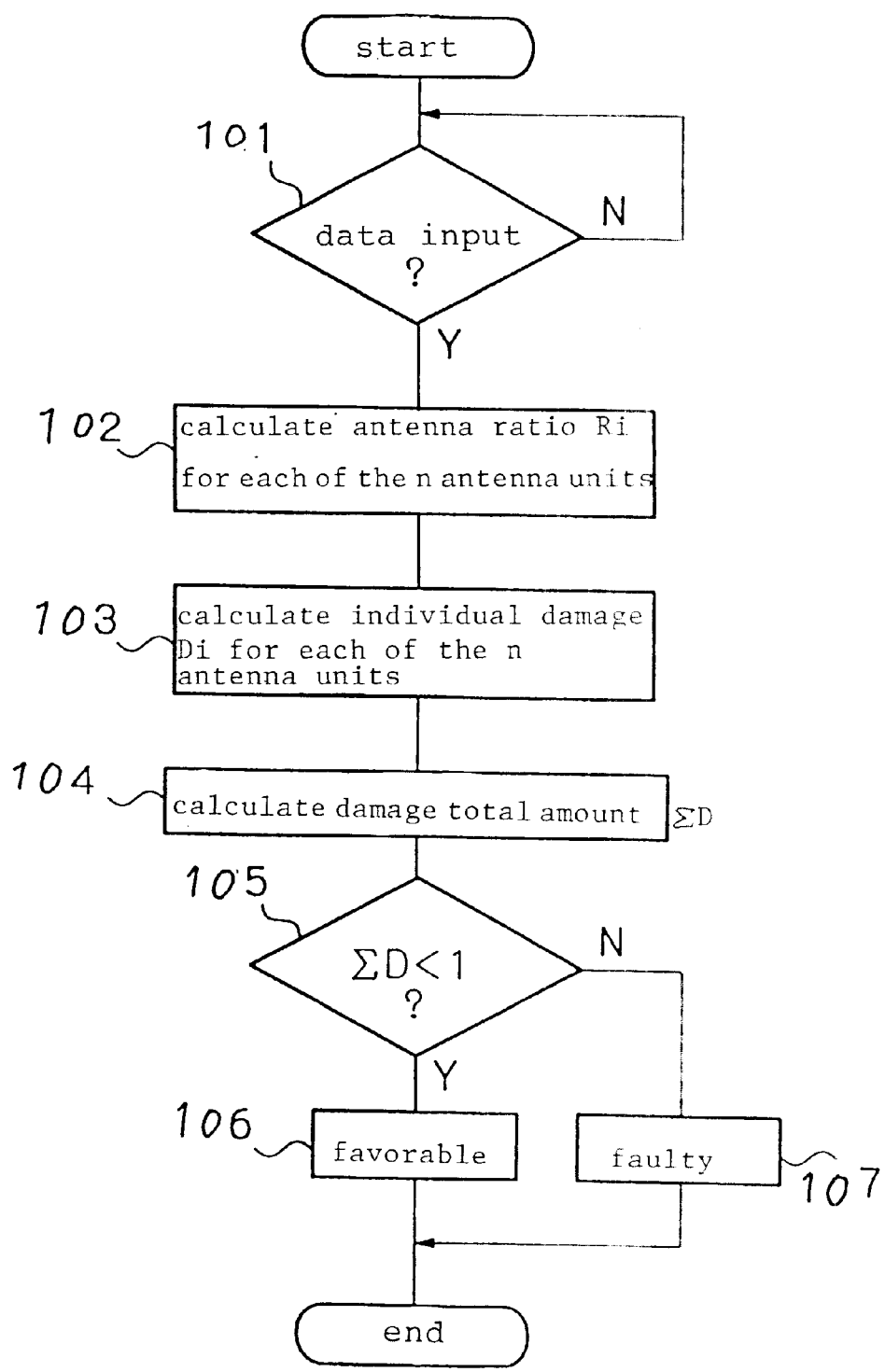
FIG. 4 is a flow chart showing a circuit design method with the circuit design apparatus shown in FIG. 3.

Next, the operation of the circuit design apparatus of the embodiment is described in detail with reference to the flow chart of FIG. 4.

First, at step 101, data input unit 110 receives actual area Sj of a gate insulating film of a transistor in a designed circuit device, maximum permissible antenna ratios Rmi of respective n antenna units of conductive members with respect to actual area Sj, and actual antenna sizes Mi of the respective n antenna units of the conductive members.

Next, at step 102, ratio calculation unit 12 calculates antenna ratio Ri for each of the n antenna units of the conductive members with respect to actual area Sj of the gate insulating area with the following equation:

$$Ri=Mi/Sj$$

In addition, at step 103, individual calculation unit 13 calculates individual damage Di for each of the n antenna units of the conductive members with respect to actual area Sj of the gate insulating film with the following equation:

$$Di=Ri/Rmi$$

At step 104, total amount calculation unit 14 sums individual damage Di calculated in individual calculation unit 13 to calculate damage total amount $\Sigma D$ acting on the gate insulating film with the following equation:

$$\Sigma D=D1+D2+\ldots+Dn$$

At step 105, pass/fail determining unit 15 determines whether damage total amount $\Sigma D$ calculated at step 104 is less than 1. If damage total amount $\Sigma D$ is determined as being less than 1 at step 105, pass/fail determining unit 15 indicates that design is favorable at step 106. If damage total amount $\Sigma D$ is determined as being equal to or greater than 1 at step 105, pass/fail determining unit 15 indicates that the design is faulty at step 107.

When the determination result by pass/fail determining unit 15 indicates favorable design, a user can see that the area of the gate insulating film of the transistor element in the designed integrated circuit device is in a proper relationship with the antenna sizes of the plurality of antenna units of the conductive members with a multilayered structure connected to the gate insulating film.

On the other hand, when the determination result by pass/fail determining unit 15 indicates faulty design, a user can see that the design of the integrated circuit device is not proper. In such a case, the user performs design changes, for example a change in the area of the gate insulating film of the transistor element, a reduction in the antenna sizes of the plurality of antenna units of the conductive members with a multilayered structure connected to the gate insulating film, or insertion of a cell as a countermeasure.

In an integrated circuit device manufactured after its favorable design is ensured as described above, antenna size Mi for each of n antenna units of conductive members with a multilayered structure with respect to area Sj of a gate insulating film satisfies the following relationship:

$$\Sigma[(Mi/Sj)/Rmi]<1$$

Such an integrated circuit device has a plurality of antenna units of proper antenna sizes in conductive members with a multilayered structure connected to a gate insulating film of a transistor element. Even when electric charge flows into the plurality of antenna units of the conductive members with a multilayered structure due to plasma processing in the manufacturing process, cumulative damage to the gate insulating film does not become critical.

In this manner, in the circuit design method using circuit design apparatus 100 of the embodiment, since it is possible to optimize the area of the gate insulating film of the transistor element and the antenna sizes of the plurality of antenna units of the conductive members with a multilayered structure, an integrated circuit device of optimal structure can be designed with high efficiency.

The embodiment has been described for a case where individual calculation unit 13 calculates individual damage Di for each of the n antenna units of the conductive members with respect to actual area Sj of the. gate insulating film with the following equation:

$$Di=Ri/Rmi$$

Individual calculation unit 13, however, may calculate individual damage Di for each of the n antenna units of the conductive members with respect to actual area Sj of the gate insulating film by using the constant a larger than 0 with the following equation:

$$Di=(Ri/Rmi)^a$$

The aforementioned constant a is a value which varies depending on the structure of the transistor element or the manufacturing process. Studies by experiments have shown that favorable results can be obtained in many cases with the constant a in a range satisfying $0.5 \leq a \leq 1.8$. Thus, the constant a is a numerical value determined by experiments before the determination whether the design of an integrated circuit device is favorable or faulty.

In addition, individual calculation unit 13 may use a predetermined function f( ) to calculate individual damage Di for each of the n antenna units of the conductive members with respect to actual area Sj of the gate insulating film with the following equation:

$$Di=f(Ri/Rmi)$$

Next, a simple description is made for a specific example in which the circuit design apparatus of the embodiment is used to actually determine whether the design of an integrated circuit apparatus is favorable or faulty. First, it is assumed that an integrated circuit apparatus to be designed and determined as being favorable or faulty includes a gate insulating film connected to wiring pattern M1, contact via V2, and wiring pattern M3 in turn. It is also assumed that they have actual antenna ratios Ri and maximum permissible antenna ratios Rmi as shown in Table 1 below. This description is made for a case where individual damage Di is calculated as Di=(Ri/Rmi)$^a$ and a is equal to 1.2.

Table 1

Damage total amount ΣD obtained by accumulating individual damage Di of antenna units M1, V2, and M3 is derived by:

$$\Sigma D = (500/1000)^a + (4/20)^a + (100/1000)^a$$

Thus, if a=1.2, ΣD=0.64. Since this value is less than 1, the design is determined as being favorable.

It can be found from the aforementioned numeric value that the design has sufficient room for extension. Thus, for example, wiring pattern M3 can be extended to the degree that its antenna ratio R3 is equal to 480, or contact via V2 can be extended to the degree that its antenna ratio R2 is equal to 11.

In the specific example, since it is assumed that wiring patterns M1 and M3 are subjected to the same plasma processing, they have the same maximum permissible antenna ratios Rmi. However, when different plasma processing is performed on wiring patterns M1 and M3, they have different maximum permissible antenna ratios Rmi from one another, for example as shown in Table 2.

Table 2

In this case, damage total amount ΣD of these antenna units M1, V2, and M3 is represented by:

$$\Sigma D = (500/550)^a + (4/20)^a + (100/1000)^a$$

Then, if a=1.2, ΣD=1.1. Since the damage total amount in this case is larger than 1, the design is determined as being faulty.

In such a case, damage total amount ΣD can be reduced to be less than 1 by, for example, shrinking wiring pattern M1 to have the actual antenna ratio equal to or less than 450, for example. When it is difficult to change the design of only wiring pattern M1, the antenna ratio of wiring pattern M1 is changed to 490 or less and the antenna ratio of contact via V2 is changed to 2 or less, thereby allowing damage total amount ΣD to be reduced to be less than 1.

The aforementioned embodiment illustrates the sequential calculations of antenna ratios Ri for the respective n antenna units of the conductive members with respect to actual area Sj of the gate insulating film, individual damage Di for the respective n antenna units of the conductive members with respect to actual area Sj of the gate insulating film, and damage total amount ΣD.

The sequential calculations, however, are illustrated for convenience to simplify the description. In an actual data processing method of circuit design apparatus 100, damage total amount ΣD can be calculated at a time from area Sj, antenna sizes Mi, and antenna ratios Rmi with the following equation:

$$\Sigma D = \Sigma[(Mi/Sj)/Rmi]$$

Second Embodiment

Next, description is made for a method and an apparatus of circuit design according to a second embodiment of the present invention. In the first embodiment described above, it is assumed that respective maximum antenna ratios Rmi for the plurality of antenna units of the conductive members input as data to circuit design apparatus 100 from the outside have been previously obtained depending on their shapes or performed processing with an existing calculating method. Maximum antenna ratio Rmi used in that case is calculated as a ratio (M0i/S0) of reference area S0 of the gate insulating film to maximum antenna size M0i for each of the antenna units of the conductive member permissible with respect to reference area S0.

In an integrated circuit device actually designed, however, the area of a gate insulating film of a formed transistor is not limited to S0, and transistors to be designed have gate insulating films of varying areas.

Nevertheless, the circuit design apparatus of the aforementioned first embodiment assumes that maximum antenna sizes M0i permitted in the conductive members is proportional to actual area Sj of the gate insulating film, that is, maximum permissible antenna ratios Rmi are constant regardless of area Sj of the gate insulating film. In reality, however, maximum permissible antenna ratios Rmi vary depending on area Sj of the gate insulating film. Thus, for more accurate determination, it is necessary to derive maximum permissible antenna ratios Rmi in accordance with actual area Sj of the gate insulating film.

In the circuit design apparatus of the second embodiment of the present invention, the value of permissible antenna ratio Rmi used in determination of whether design is favorable or faulty is calculated in accordance with actual area Sj of the gate insulating film.

Figure 5:
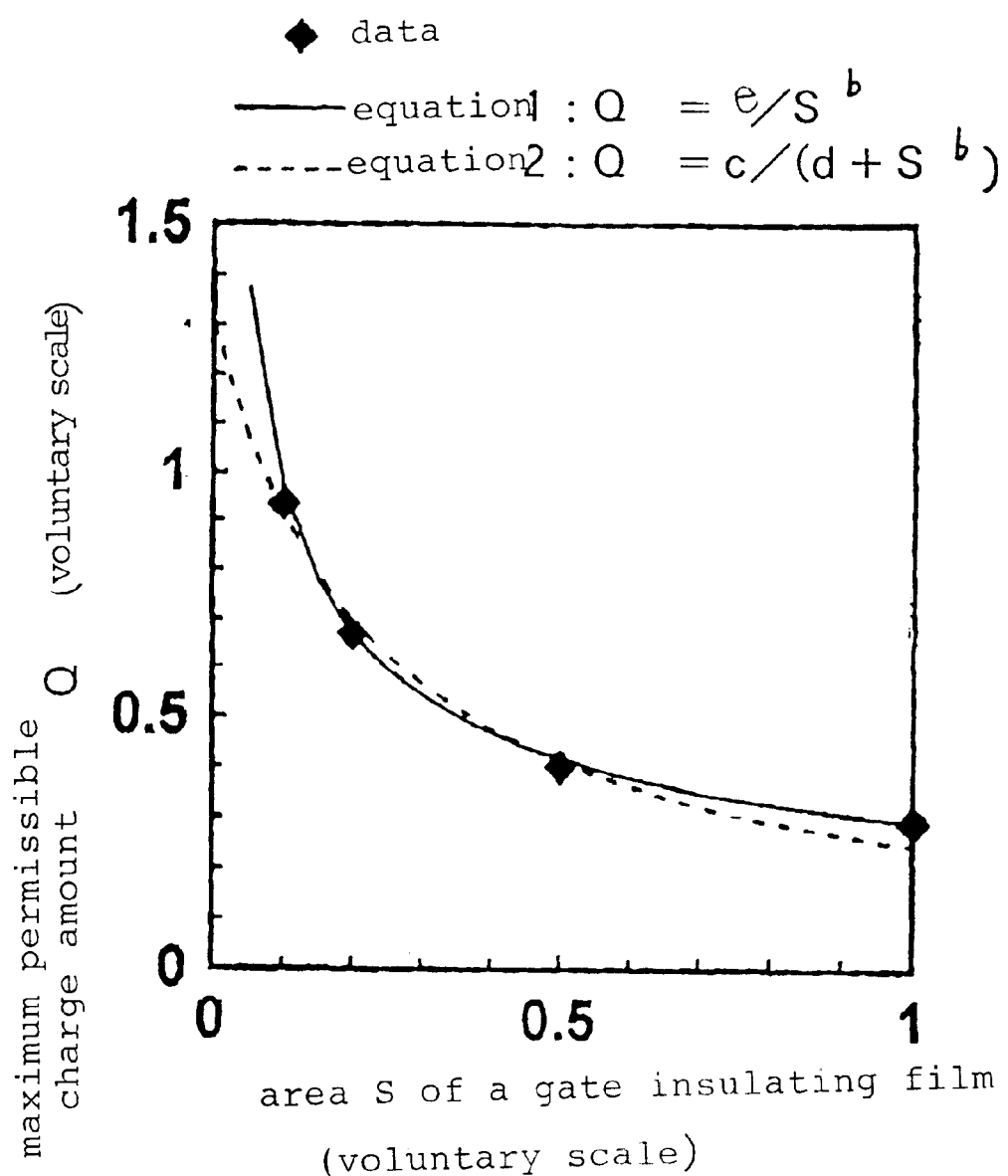
FIG. 5 is a graph showing a relationship between area Sj of a gate insulating film and maximum permissible electric charge amount Q.

FIG. 5 shows a relationship between actual area S of a gate insulating film and maximum electric charge amount Q which can be passed without damaging the gate insulating film.

The curves in FIG. 5 can be approximately represented by the following equation (1) or (2).

$$Q = e/S^b \qquad (1)$$

where e, b are predetermined constants, $$Q = c/(d+S) \qquad (2)$$

where c, d are predetermined constants.

First, description is made for a method of calculating maximum permissible antenna ratio Rmi in accordance with actual area Sj of the gate insulating film with the aforementioned equation (1).

Assuming that a maximum electric charge amount which can be passed without damaging the gate insulating film when area S of the gate insulating film is Sj is Qj, and a maximum electric charge amount which can be passed without damaging the gate insulating film when area S of the gate insulating film is S0 is Q0, the following is obtained:

$$Qj = e/Sj^b, \quad Q0 = e/S0^b$$

Since maximum permissible antenna ratio Rmi is proportional to the maximum electric charge amount which can be passed without damaging the gate insulating film, it can be derived with the following equation (3):

$$Rmi = (M0i/S0) \times (Qj/Q0) \qquad (3)$$
$$= (M0i/S0) \times (S0/Sj)^b$$

Next, description is made for a method of calculating maximum permissible antenna ratio Rmi in accordance with actual area Sj of the gate insulating film with the aforementioned equation (2).

Assuming that a maximum electric charge amount which can be passed without damaging the gate insulating film when area S of the gate insulating film is Sj is Qj, and a maximum electric charge amount which can be passed without damaging the gate insulating film when area S of the gate insulating film is S0 is Q0, the following is obtained:

$$Qj=c/(d+Sj), Q0=c/(d+S0)$$

Since maximum permissible antenna ratio Rmi is proportional to the maximum electric charge amount which can be passed without damaging the gate insulating film, it can be derived with the following equation:

$$Rmi = (M0i/S0) \times (Qj/Q0)$$
$$= (M0i/S0) \times [(d+S0)/(d+Sj)]$$
$$= (M0i/S0) \times [(d/S0+1)/(d/S0+Sj/S0)]$$

if $d/s0+1=\alpha$ and $d/S0=\beta$, the following equation (4) is obtained:

$$Rmi=(M0/S0)\times[\alpha/(\beta+Sj/S0)] \qquad (4)$$

Therefore, if reference area S0 of the gate insulating film, actual area Sj of the gate insulating film, and maximum antenna size M0i permitted in the conductive member with respect to reference area S0 of the gate insulating film are given, the aforementioned equation (3) or (4) can be used to calculate the value of maximum permissible antenna ratio Rmi in accordance with actual area Sj of the gate insulating film. Maximum permissible antenna ratio Rmi calculated in this method can be used to derive damage total amount $\Sigma D$ with the method described in the aforementioned first embodiment for determination of whether design is favorable or faulty, thereby making it possible to obtain a more accurate determination result.

Since the aforementioned constants b, $\alpha$, and $\beta$ reflect the rate of damage to the antenna sizes of the conductive members, they are determined as constants depending on the structure of a transistor element or the manufacturing process. Studies by experiments have shown that the constant b is preferably in a range of $-2.0 \leq b \leq 0.8$, and the constants $\alpha$, $\beta$ preferably satisfy $\beta < \alpha$, $0.9 \leq \alpha \leq 2.2$, and $0.1 \leq \beta \leq 1.3$.

Next, simple description is made for a specific example in which maximum permissible antenna ratio Rmi is calculated as $R0 \times (S0/Sj)^b$ as described above. It is assumed that, as in the aforementioned Table 1, actual antenna ratios Ri and maximum permissible antenna ratios Rmi of wiring pattern M1, contact via V2, and wiring pattern M3 have been obtained.

Damage total amount $\Sigma D$ in this case is derived as follows:

$$\Sigma D=(500/1000)^{1.2}+(4/20)^{1.2}+(100/1000)^{1.2}=0.64<1$$

which indicates that design is favorable and has sufficient room. Thus, assume herein that the area of the gate insulating film is changed from such a state.

For example, when area Sj of the gate insulating film is changed to be twice, maximum permissible antenna ratio Rmi is a value calculated by:

$$Rmi=(M0i/S0)\times(S0/Sj)^b$$

and thus maximum permissible antenna ratio Rmi after the change is equal to $(\frac{1}{2})^b$ of the value before the change.

If b=0.64, maximum antenna ratios Rmi permitted in antenna units M1, V2, M3 are as follows:
(Table 3)

If the actual antenna ratio Ri are the same, damage total amount $\Sigma D$ in this case is derived as follows:

$$\Sigma D=(500/615)^{1.2}+(4/12.3)^{1.2}+(100/615)^{1.2}=1.15$$

which is greater than 1. Thus, the design is determined as being faulty, and it can be seen that area Sj of the gate insulating area cannot be changed to be twice, if the antenna ratio Ri are the same.

When it is still desired to change area Sj of the gate insulating film to be twice, damage total amount $\Sigma D$ can be reduced to be less than 1 by, for example, shrinking wiring pattern M1 to have the actual antenna ratio equal to or less than 416, thereby making it possible to prevent breakdown of the gate insulating film.

While preferred embodiments of the present invention have been described using specific terms, such description is for illustrative purposes only, and it is to be understood that changes and variations may be made without departing from the spirit or scope of the following claims.

TABLE 1

|    | Ri  | Rmi  |
|----|-----|------|
| M1 | 500 | 1000 |
| V2 | 4   | 20   |
| M3 | 100 | 1000 |

TABLE 2

|    | Ri  | Rmi  |
|----|-----|------|
| M1 | 500 | 550  |
| V2 | 4   | 20   |
| M3 | 100 | 1000 |

TABLE 3

|    | Ri  | Rmi                             |
|----|-----|---------------------------------|
| M1 | 500 | 615 (=1000 × (1/2)$^{0.64}$)    |
| V2 | 4   | 12.3 (=20 × (1/2)$^{0.64}$)     |
| M3 | 100 | 615 (=1000 × (1/2)$^{0.64}$)    |

What is claimed is:

1. A circuit design method for designing an integrated circuit device including conductive members with a multi-layered structure connected to a gate insulating film of a transistor element, said method comprising the steps of:
   calculating damage to said gate insulating film for each of a plurality of antenna units of said conductive members; and
   if a cumulative sum of the calculated damage is greater than or equal to a predetermined value, changing the design of an integrated circuit device such the cumulative sum of the calculated damage becomes less than said predetermined amount.

2. A circuit design method for designing an integrated circuit device including conductive members with a multi-layered structure connected to a gate insulating film of a transistor element, said method comprising the steps of:
   calculating an antenna ratio Ri, for $1 \leq i \leq n$, for each of n antenna units of said conductive members from an antenna size Mi, for $1 \leq i \leq n$, for each of the n antenna units of said conductive members and an actual area of Sj of said gate insulating film from the equation:

$$Ri=Mi/Sj$$

calculating individual damage Di, for $1 \leq i \leq n$, for each of the n antenna units of said conductive members with respect to said actual area Sj of said gate insulating film from a maximum permissible antenna ratio Rmi, for $1 \leq i \leq n$, for each of the n antenna units of said conductive members with respect to said actual area Sj of said gate insulating film from the equation:

$$Di=f(Ri/Rmi)$$

where f( ) is a predetermined function calculating a damage total amount $\Sigma D=D1+D2+ \ldots +Dn$ acting on said gate insulating film from the preceding calculating results;

if said damage total amount $\Sigma D$ is greater than or equal to 1, changing the design of an integrated circuit device such the damage total amount $\Sigma D$ becomes less than 1.

3. A circuit design method according to claim 2, wherein said Di=(Ri/Rmi) is calculated from the equation:

$$Di=(Ri/Rmi)^a$$

where a is a constant larger than 0.

4. A circuit design method according to claim 3, wherein said constant a satisfies the relationship:

$$0.5 \leq a \leq 1.8.$$

5. A circuit design method according to claim 2, further comprising the step of calculating the maximum permissible antenna ratio Rmi for each of the n antenna units of said conductive member for the actual area Sj of said gate insulating film when a maximum permissible antenna size M0$i$ is defined for each of the n antenna units of said conductive members with respect to a reference area S0 of said gate insulating film from the equation:

$$Rmi=(M0i/S0) \times (S0/Sj)^b$$

where b is a predetermined constant.

6. A circuit design method according to claim 2, further comprising the step of calculating the maximum permissible antenna ratio Rmi for each of the n antenna units of said conductive member for the actual area Sj of said gate insulating film when a maximum permissible antenna size M0$i$ is defined for each of the n antenna units of said conductive members with respect to a reference area S0 of said gate insulating film from the equation:

$$Rmi=(M0i/S0) \times [\alpha/(\beta+Sj/S0)]$$

where $\alpha, \beta$ are predetermined constants.

7. A circuit design method according to claim 5, wherein said constant b satisfies the relationship:

$$-2.0 \leq b \leq 0.8.$$

8. A circuit design method according to claim 6, wherein said constant $\alpha, \beta$ satisfies the relationship:

$$\beta < \alpha,$$
$$0.9 \leq \alpha \leq 2.2,$$
$$0.1 \leq \beta \leq 1.3.$$

9. A circuit design apparatus for use in design of an integrated circuit device including conductive members with a multilayered structure connected to a gate insulating film of a transistor element, comprising:

data input means for receiving, as data, an actual area Sj of said gate insulating film, a maximum permissible antenna ratio Rmi, for $1 \leq i \leq n$, for each of n antenna units of said conductive members with respect to said area Sj, and an antenna size Mi, for $1 \leq i \leq n$, for each of said antenna units;

ratio calculating means for calculating, in response to the data input to said data input means, an antenna ratio Ri, for $1 \leq i \leq n$, for each of the n antenna units of said conductive members with respect to the actual area Sj of said gate insulating film from the equation:

$$Ri=Mi/Sj;$$

individual calculation means for calculating individual damage Di, for $1 \leq i \leq n$, for each of the n antenna units of said conductive members with respect to the actual area Sj of said gate insulating film from the equation:

$$Di=f(Ri/Rmi)$$

where f( ) is a predetermined function; and total amount calculation means for calculating a damage total amount $\Sigma D=D1+D2+ \ldots +Dn$ acting on said gate insulating film from the calculating results in said individual calculation means.

10. A circuit design apparatus according to claim 9, further comprising pass/fail determining means for indicating that design is faulty when said damage total amount $\Sigma D$ calculated by said total amount calculation means is equal to or greater than 1.

11. A circuit design apparatus according to claim 9, wherein said individual calculation means calculates said individual damage Di for each of the n antenna units of said conductive members from the equation:

$$Di=(Ri/Rmi)^a$$

where a is a constant larger than 0.

12. An integrated circuit device comprising conductive members with a multilayered structure connected to a gate insulating film of a transistor element, wherein a maximum permissible antenna ratio Rmi, for $1 \leq i \leq n$, is set for each of n antenna units of said conductive members with respect to an actual area Sj of said gate insulating film; and an antenna size Mi, for $1 \leq i \leq n$, for each of the n antenna units of said conductive members with respect to the actual area Sj of said gate insulating film satisfies the relationship:

$$\Sigma[f((Mi/Sj)/Rmi)]<1$$

where f( ) is a predetermined function.

13. An integrated circuit device comprising conductive members with a multilayered structure connected to a gate insulating film of a transistor element, wherein a maximum permissible antenna ratio Rmi, for $1 \leq i \leq n$, is set for each of n antenna units of said conductive members with respect to an actual area Sj of said gate insulating film; and an antenna size Mi, for $1 \leq i \leq n$, for each of the n antenna units of said conductive members with respect to the actual area Sj of said gate insulating film satisfies the relationship:

$$\Sigma[((Mi/Sj)/RMi)^a]<1$$

where a is a constant larger than 0.

* * * * *